United States Patent
Bozso et al.

(10) Patent No.: US 7,548,431 B2
(45) Date of Patent: Jun. 16, 2009

(54) OPTICALLY CONNECTABLE CIRCUIT BOARD WITH OPTICAL COMPONENT(S) MOUNTED THEREON

(75) Inventors: Ferenc M. Bozso, Ridgefeild, CT (US); Phillip G. Emma, Danbury, CT (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 11/923,905

(22) Filed: Oct. 25, 2007

(65) Prior Publication Data

US 2008/0107374 A1    May 8, 2008

Related U.S. Application Data

(62) Division of application No. 11/450,258, filed on Jun. 9, 2006, and a division of application No. 10/305,822, filed on Nov. 27, 2002, now Pat. No. 7,095,620.

(51) Int. Cl.
*H05K 7/02* (2006.01)
*H05K 7/06* (2006.01)
*H05K 7/08* (2006.01)
*H05K 7/10* (2006.01)

(52) U.S. Cl. .................. 361/760; 361/763; 361/767; 361/803

(58) Field of Classification Search .................. None
See application file for complete search history.

(56) References Cited

U.S. PATENT DOCUMENTS

| | | | |
|---|---|---|---|
| 4,465,333 | A | 8/1984 | Caserta et al. |
| 5,069,522 | A | 12/1991 | Block et al. |
| 5,245,680 | A | 9/1993 | Sauter |
| 5,337,398 | A | 8/1994 | Benzoni et al. |
| 5,353,192 | A | 10/1994 | Nordin |
| 5,513,073 | A | 4/1996 | Block et al. |
| 6,654,515 | B2 | 11/2003 | Kato et al. |
| 6,661,940 | B2 | 12/2003 | Kim |

FOREIGN PATENT DOCUMENTS

| | | |
|---|---|---|
| JP | PUPA04106977 | 4/1992 |
| JP | PUPA0677672 | 3/1994 |
| JP | PUPA095580 | 1/1997 |
| JP | PUPA2001350055 | 12/2001 |
| WO | WO9610763 | 4/1996 |
| WO | WO9731280 | 8/1997 |

*Primary Examiner*—Tuan T Dinh
(74) *Attorney, Agent, or Firm*—Law Office of Charles W. Peterson, Jr.; Brian P. Verminski, Esq.

(57) ABSTRACT

An optically connectable circuit board and optical components mounted thereon. At least one component includes optical transceivers and provides an optical connection to the board. Electronic components may be directly connected to the board electrically or optically. Also, some electronic components may be indirectly connected optically to the board through intermediate optical components.

6 Claims, 16 Drawing Sheets

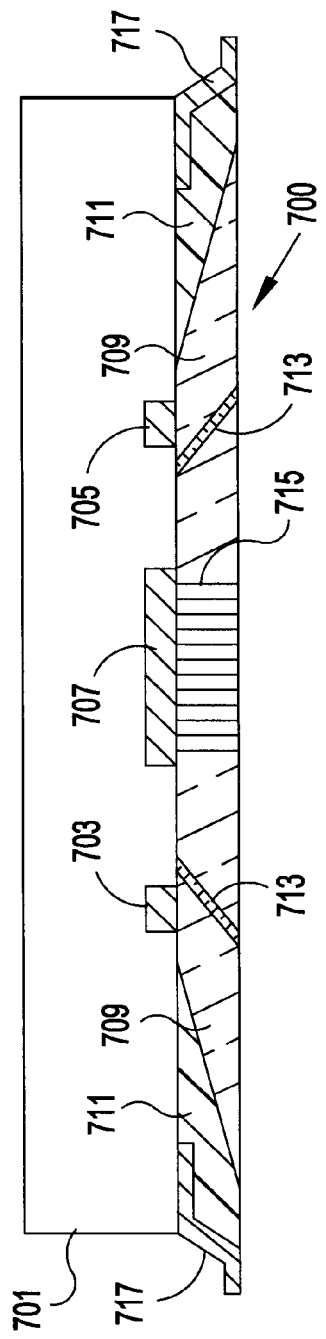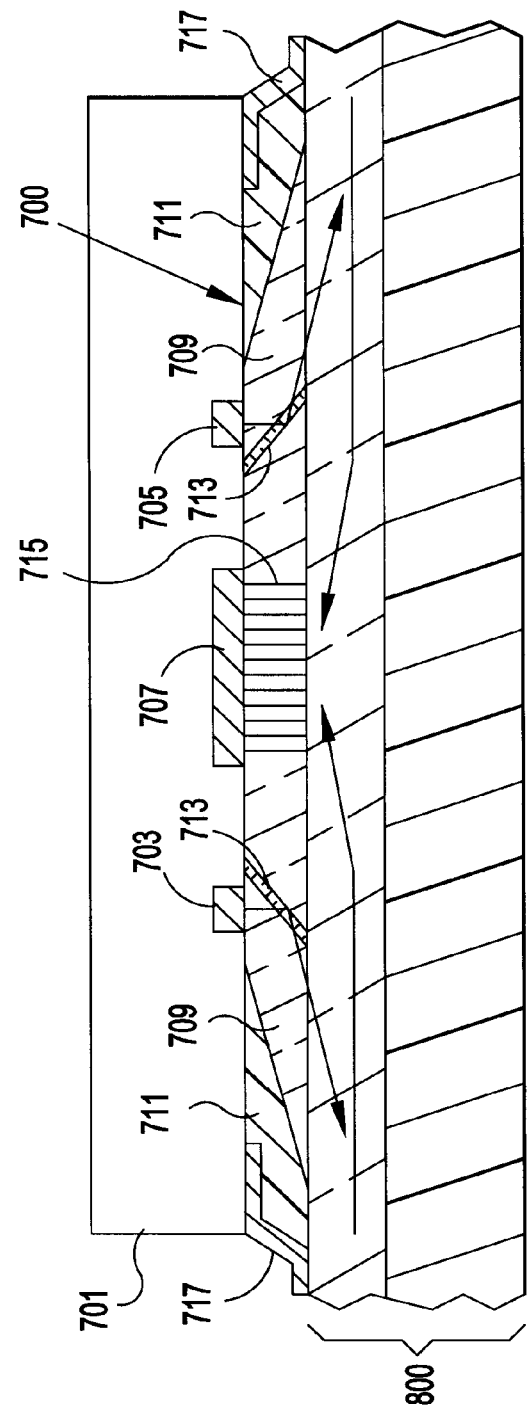

OPTICALLY CONNECTABLE CIRCUIT BOARD WITH OPTICAL COMPONENT(S) MOUNTED THEREON

CROSS REFERENCE TO RELATED APPLICATIONS

The present application is a divisional application of U.S. patent application Ser. No. 11/450,258 entitled "OPTICALLY CONNECTABLE CIRCUIT BOARD WITH OPTICAL COMPONENT(S) MOUNTED THEREON" to Ferenc BOZSO et al., filed Jun. 9, 2006, and of 10/305,822, filed Nov. 27, 2002, now U.S. Pat. No. 7,095,620 entitled "OPTICALLY CONNECTABLE CIRCUIT BOARD WITH OPTICAL COMPONENT(S) MOUNTED THEREON" to Ferenc BOZSO et al., issued Aug. 22, 2006, the contents of which are incorporated herein by reference; and related to allowed U.S. patent application Ser. No. 10/305,516 entitled "HIGH SPEED DATA CHANNEL INCLUDING A CMOS VCSEL DRIVER AND A HIGH PERFORMANCE PHOTODETECTOR AND CMOS PHOTORECEIVER" to Boszo et al., to U.S. Pat. No. 7,120,327, entitled "BACKPLANE ASSEMBLY WITH BOARD TO BOARD OPTICAL INTERCONNECTIONS" to Boszo et al., issued Oct. 10, 2006, to U.S. patent application Ser. No. 11/876,605, entitled "HIGH SPEED DATA CHANNEL INCLUDING A CMOS VCSEL DRIVER AND A HIGH PERFORMANCE PHOTODETECTOR AND CMOS PHOTORECEIVER" to Boszo et al., filed Oct. 22, 2007, to U.S. patent application Ser. No. 11/923,924 entitled "OPTICALLY CONNECTABLE CIRCUIT BOARD WITH OPTICAL COMPONENT(S) MOUNTED THEREON" to Ferenc BOZSO et al., filed coincident herewith, and to U.S. patent application Ser. No. 11/923,956 entitled "OPTICALLY CONNECTABLE CIRCUIT BOARD WITH OPTICAL COMPONENT(S) MOUNTED THEREON" to Ferenc BOZSO et al., also filed coincident herewith; all assigned to the assignee of the present invention.

BACKGROUND OF THE INVENTION

1. Field of the Invention

The present invention generally relates to high-speed inter chip optical connections and more particularly to high speed optical inter board connections between logic and/or memory chips on different printed circuits, e.g., connected to a backplane.

2. Description of the Related Art

FIG. 1 shows an example of a state of the art electro-optical assembly 100 with a passive backplane 101 connecting two circuit boards 103 each with mounted electro-optical components 105. The boards 103 pass signals to each other over the passive backplane 101 through connectors 107. Chips 108, 110, 112, 114 populate and are packaged in the optical component modules 105.

FIGS. 2A-B show an example of typical orthogonal cross sections of the general board structure 200 of either/both of the backplane and circuit boards. This passive board structure 200 includes both electrical wiring channels 203 and optical wiring channels 205. A dielectric backplane/board material 201 provides a mechanical structure for maintaining and protecting the embedded copper wiring infrastructure and power distribution on wiring channels 203. Wiring channels 203 provide electronic signal media in the X and Y dimensions with interlayer or interlevel vias (not shown) connecting electrical signals between different wiring layers.

On one surface of the backplane/board are optical wave guides 205, which are shown here in a single layer. These optical wave guides 205 can be a suitable polymer or glass material deposited on the preexisting surface of the backplane/board material, or it can be an independently manufactured structure containing polymers or glass or optical fibers, that is laminated onto the board material. A fill material 207 separates the optical wave guides. The fill 207 provides isolation and planarity.

So, from FIG. 1 typical losses in a chip-to-chip (e.g., 108-112) optical path crossing the backplane 101 can be determined. In this example, the onboard path may be 50 centimeters for each board 103, with the boards spaced apart on the backplane 101 by 1 meter. The optical material is a polymer, for example. A typical board polymer exhibits a 0.03 dB/cm loss and a typical backplane polymer exhibits a 0.05 dB/cm loss. A typical chip to board coupling loss is 3 dB and a typical board to backplane connector loss is 2 dB. Thus, for this path, the signal loss is 18 dB.

This 18 dB loss is substantial and, remembering that each 3 dB drop corresponds to a loss of halving the signal, corresponds to a sixty four time signal reduction, i.e., the receiver signal at chip 114 is ¹⁄₆₄ the strength at chip 108. So, to compensate for an 18 dB loss the transmitted signal at chip 108 must have 64× the signal required at the receiver chip 114. This is an unacceptable power requirement, particularly when tens of these signals are required for a typical data path and well in excess of what is usually allowed for data communications optical paths.

There are a number of known approaches to driving down these losses. Chip-to-board coupling losses can be reduced with better electro-optical packaging. Better materials can be used to reduce Channel losses, e.g., laminating fibers into the board (instead of depositing a polymer) is a costly approach to making channel losses negligible. Finally, improved (and more expensive) connectors can reduce board-to-backplane coupling loss. Connector losses result primarily from mechanical mismatches and so, can be improved by reducing tolerances, e.g., with precision mechanical machining. Unlike material changes (e.g., in the channels), precision mechanical machining requires new and better tools and processing, which is not an incremental cost increase. Each of these three state of the art approaches produce incremental improvements only with solving difficult engineering problems accompanied by sometimes dramatic cost increases. It may be possible using some combination of these approaches to reduce the loss of the above example from 18 dB to an acceptable level, e.g., 9 dB or an 8× reduction from the transmitted signal to the receiver.

FIG. 3 shows an example of a multidrop backplane 300, e.g., in a large switch or a server backplane. There may be thousands of such signals on a typical such backplane 300. Such a multidrop backplane 300 is particularly suited for servers to bus or distribute (multidrop) the signals, i.e., to fan out each transmitted signal in parallel to numerous (e.g., 8, 16, or even 32) boards 302 connected to the backplane 300.

However, with the boards 302 connected to "tap points" along the backplane optical channels, some signal is lost at each tap point. So, if each "tap point" causes a few dB signal drop from the originally transmitted signal strength (a 3 dB drop per tap point is quite optimistic), adding 3 boards to the improved path increases the total signal loss back to 18 dB. Clearly, the added work and expense has not provided for inclusion of more than a few more boards. For thousand of signals (instead of tens of signals), the total power required is prohibitive.

Furthermore, such a 4 to 5 board system would be inflexible, unscalable beyond 5 boards. Likewise removing 1 or 2 boards for a midrange system would not scale particularly easily either. Signal integrity and radiation issues would arise in the infrastructure which is designed for the 4-5 board system.

Thus, there is a need for an assembly including a backplane with multiple boards optically connected together for use in a large switch or in a server. There is a further need for such an assembly that may be constructed from a wide range of wave guide materials and in particular, those that are tolerant of channel loss. Further, there is a need for such an assembly that is tolerant of mechanical misalignment, thereby avoiding a requirement for precise mechanical alignment (i.e., that is tolerant of large coupling loss in the board-to-backplane connectors). There is also a need for such an assembly that allows multidropping signals transmitted from one board, so that multiple boards can receive the signal. Finally, there is a need for a scalable assembly that allows for a wide range of system scaling (i.e., a few boards to many boards) on a single physical infrastructure or backplane.

SUMMARY OF THE INVENTION

It is a purpose of the present invention to improve system communications;

It is yet another purpose of the invention to improve onboard communications.

The present invention relates to an optically connectable circuit board and optical components mounted thereon. At least one component includes optical transceivers and provides an optical connection to the board. Electronic components may be directly connected to the board electrically or optically. Also, some electronic components may be indirectly connected optically to the board through intermediate optical components.

BRIEF DESCRIPTION OF THE DRAWINGS

The foregoing and other objects, aspects and advantages will be better understood from the following detailed description of illustrative embodiments of the invention with reference to the drawings, in which:

FIG. 7 shows an example of a cross section of a grating structure for coupling transceiver optics in a chip to an optical channel on a board or backplane according to a preferred embodiment of the present invention;

FIG. 8 shows an example of a preferred gating structure and chip mounted on a board structure, e.g., a backplane;

DESCRIPTION OF PREFERRED EMBODIMENTS OF THE INVENTION

Figure 4:
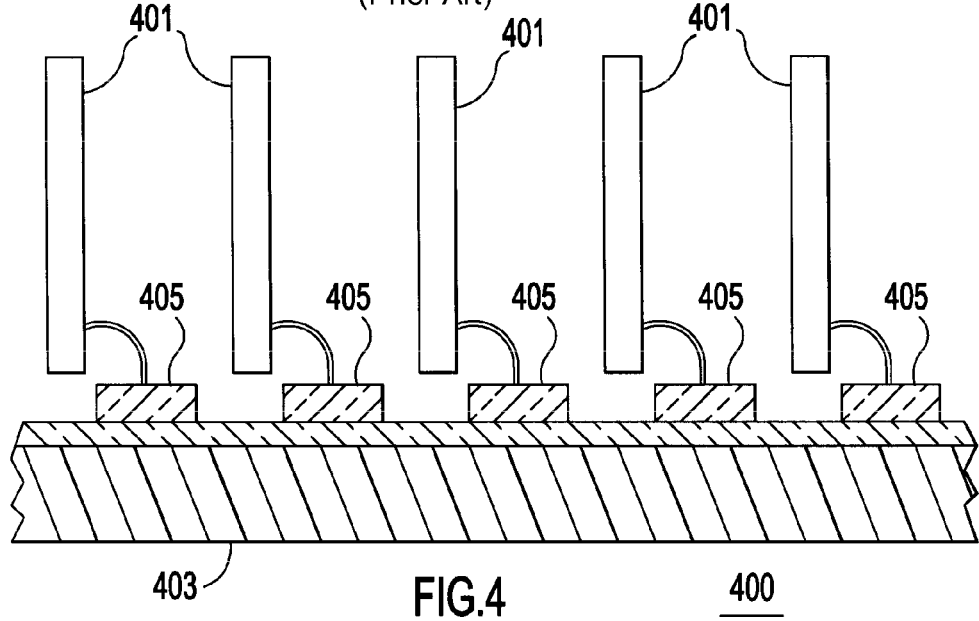
FIG. 4 shows an example of a backplane assembly 400 according to a embodiment of the invention.

Turning now to the drawings and, more particularly, FIG. 4 shows an example of preferred embodiment boards 401 mounted on a backplane assembly 400 such as is described in U.S. patent application Ser. No. 7,120,327, entitled "BACKPLANE ASSEMBLY WITH BOARD TO BOARD OPTICAL INTERCONNECTIONS" to Boszo et al. filed coincident herewith, assigned to the assignee of the present invention and incorporated herein by reference. Each preferred embodiment board 401 is mounted on and optically connected to the backplane 403 through an optical transceiver 405. Also, as further described hereinbelow, chips may be mounted on a preferred embodiment substrate or interposer and are optically connected to the preferred embodiment board 401. The optical transceiver 405 receives inputs and repeats or relays the received input optical signals using its own active circuitry. The repeated signals are transmitted to the transceiver outputs.

The optical transceivers 405 isolate all board losses from the backplane losses, thereby making each of the board design specifics irrelevant to and independent of the backplane design and vice-versa. Thus, the onboard losses are self-contained within each board 401 and do not add to the backplane losses. Likewise, backplane losses are self-contained within the backplane 403 and do not affect board losses. Thus, fan-out on the backplane 403 is a self-contained and manageable design problem. Also, very lossy connectors can be used to connect the boards to the transceivers 405, since the connector loss is isolated and so, not additive to the backplane loss.

Figure 5:
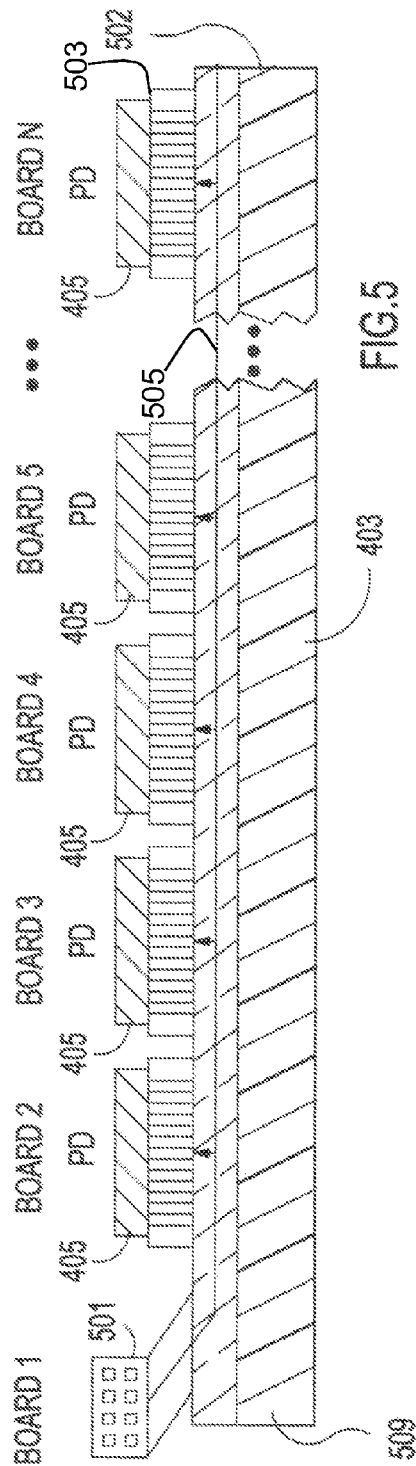
FIG. 5 illustrates fan-out on the self-contained backplane of FIG. 4.

FIG. 5 illustrates fan-out on the self-contained backplane 403 of FIG. 4. A laser source 500 is shown at one end 501 (i.e., on an unshown board located there) of the backplane 403 for the worst-case optical path 505 in this N-board system example. The worst case path 505 spans the entire backplane 403, incurring the maximum possible channel loss, fanning out to all of the remaining N−1 transceivers 405 along the channel or path 505.

So, for example, a photodetector in each transceiver may require a 20 µW optical signal to sense the signal properly, e.g., at several GHz. With a 3 dB backplane-to-photodetector loss in the grating coupling 503, optical power to the end or Nth transceiver must be at least 40 µW at the far end 502 of the board 403. The optical gratings 503 are identical and each outcouples something less than 100% of the power in the channel, i.e., some portion (X%) is outcoupled. So, for an N board system, the link budget must accommodate N−1 grating losses (i.e., (N−1)*X%) plus the 3 dB channel loss. For a 10 mW laser 501 at 40% quantum yield and with a 3 dB coupling loss to the backplane channel 505, delivers 2 mW to the channel 505 directly under the laser 501 at the left end 509. Thus, Table 1 shows an example of a link budget for this example for different values of X, in this example for X=2, 4, 6, 8, and 10. Channel loss outcoupling amounts are compared for each value against how much power is required to reach the far end and the total link budget for 2 mW (2000 µW) at the source.

TABLE 1

Link Budget Calculation

| % Outcoupled Power per Grating | Corresponding Loss per grating (dB) | Power Required at the Far End (µW) | Link Budget with 2000 µW at Source |
|---|---|---|---|
| 2 | 0.09 | 2,000 | 0 |
| 4 | 0.18 | 1,000 | 3 |
| 6 | 0.27 | 667 | 4.8 |
| 8 | 0.36 | 500 | 6 |
| 10 | 0.46 | 400 | 7 |

Figure 6:
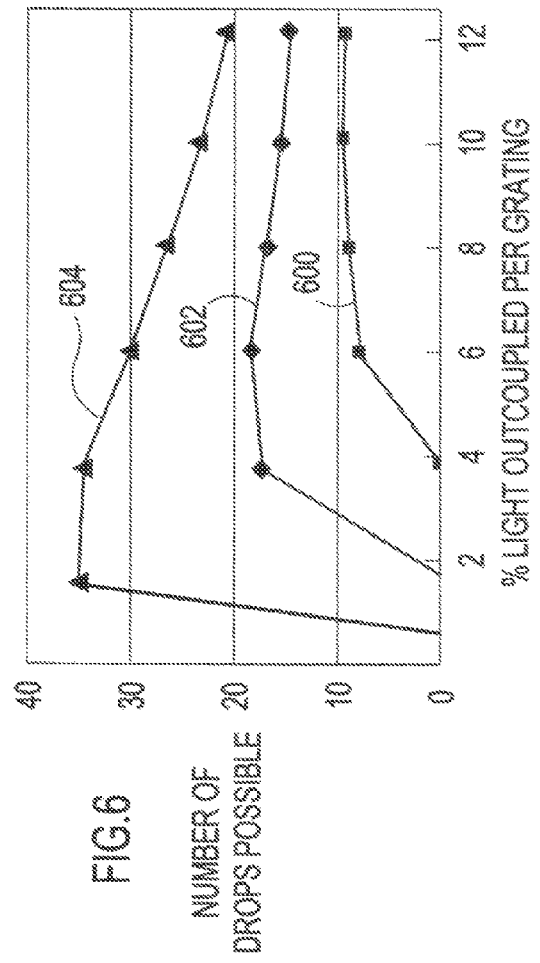
FIG. 6 is a plot of achievable number of boards N vs. percent of outcoupled power per grating.

FIG. 6 is a plot of achievable system size (number of boards N) vs. percent of outcoupled power per grating (X% which is a design parameter) based on Table 1 for three examples. In the lowest curve 600, the channel is 1 meter with a 0.03 dB/cm channel loss and a maximum system size of 10 boards. This 10 board maximum is achieved with the gratings designed for 10-12% outcoupling. The middle curve 602 shows a lossless channel material (e.g., fiber) has an 18 board maximum system size with gratings designed for 6% outcoupling. Alternately, this 18 board maximum can be achieved with the middle curve 600 by doubling source laser power, e.g., by using 2 lasers instead of 1. The highest curve 604 shows a channel with both a lossless material and source laser power doubled achieves a 35 board system maximum with gratings having 2-4% outcoupling.

FIG. 7 shows an example of a cross section of a grating structure 700 for coupling transceiver optics in a chip 701 to an optical channel on a board or backplane according to a preferred embodiment of the present invention. The chip 701 contains a laser 703 that transmits light in one direction, a laser 705 that transmits light in the opposite direction and a photodiode 707 receiving and detecting laser energy from other boards. The two lasers 703, 705 are driven by the same chip signal (not shown). Two lasers 703, 705 accommodate internal backplane board positions, i.e., those that are not at either end of the backplane. One laser 703 transmits to boards to one side, e.g., its left, and the other laser 705 transmits boards on its other side, i.e., to its right. The photodiode 707 senses light traveling in the channel that is outcoupled from the backplane (not shown) by the grating structure 700 to the chip 701.

In this example, a tapered matched-index layer 709 is insulated by a low-index material 711. Mirrors 713 direct incident laser light from the chip 701 to either side (e.g., leftwards or rightwards) into the channel (not shown). A grating 715 in the matched-index layer 709 is designed to provide the desired amount of outcoupling as provided above in Table 1 and FIG. 6. Power connections 717 connect power from the backplane or board (not shown) to the optoelectronics circuits on the chip 701.

FIG. 8 shows an example of a preferred gating structure 700 and chip 701 mounted on a board structure 800, e.g., a backplane. The grating structure 700 provides coupling between the chip 701 and the optical channel 802 in the board structure 800. It should be noted that the photodiode 707 does not sense light transmitted from the same chip 701 because, the mirrors 713 direct the light away from the grating 715 (i.e., to the left and the right) and the photodiode 707 is in the center of the chip 701 above the grating 715.

Figure 9:
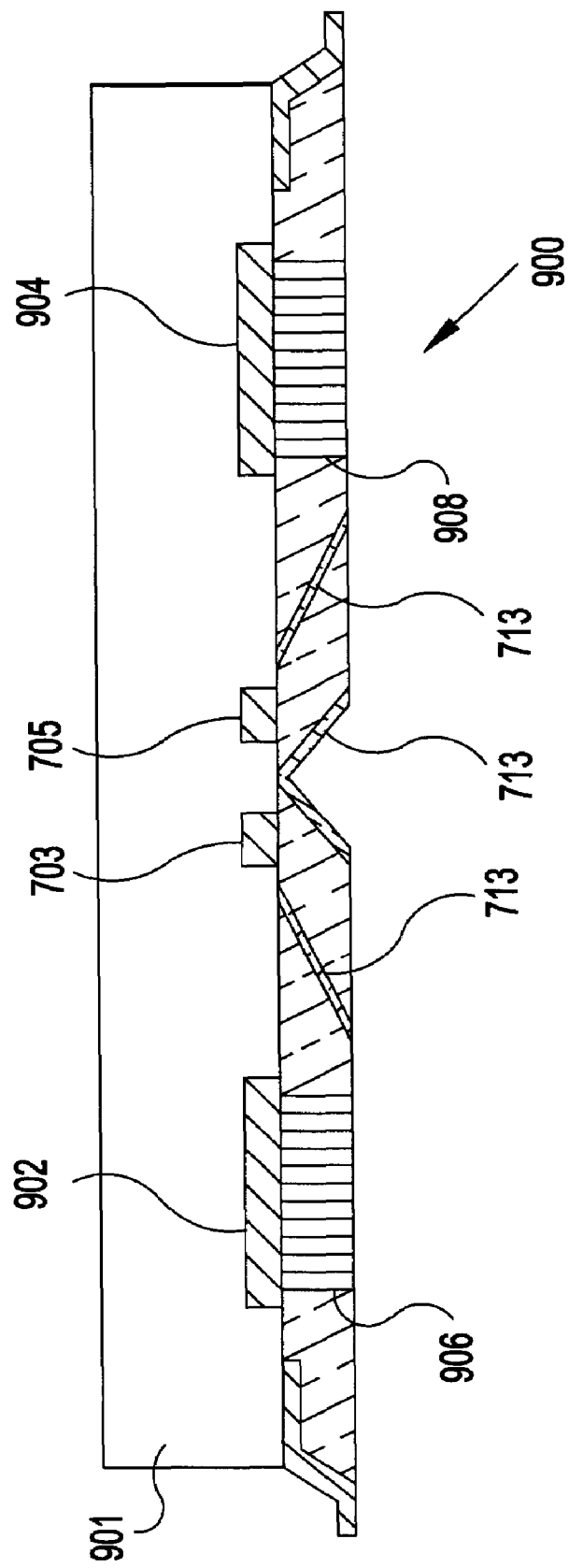
FIG. 9 shows an example of an alternative embodiment grating structure.

FIG. 9 shows an example of an alternative embodiment grating structure 900 with like elements labeled identically. In this embodiment 900, the lasers 703, 705 are in the center of the chip 901 and a pair of identical photodiodes 902, 904 and gratings 906, 908 are located on either side of the lasers 703, 705. The two photodiodes 902, 904 are wired together (not shown) to act as a single photodiode. The advantage of this embodiment is that the photodiodes 902, 904 can sense light in the channel that was transmitted by this same chip, which may be used in testing. When a board is inserted into the backplane, a continuity check can be done using this embodiment.

Figure 10:
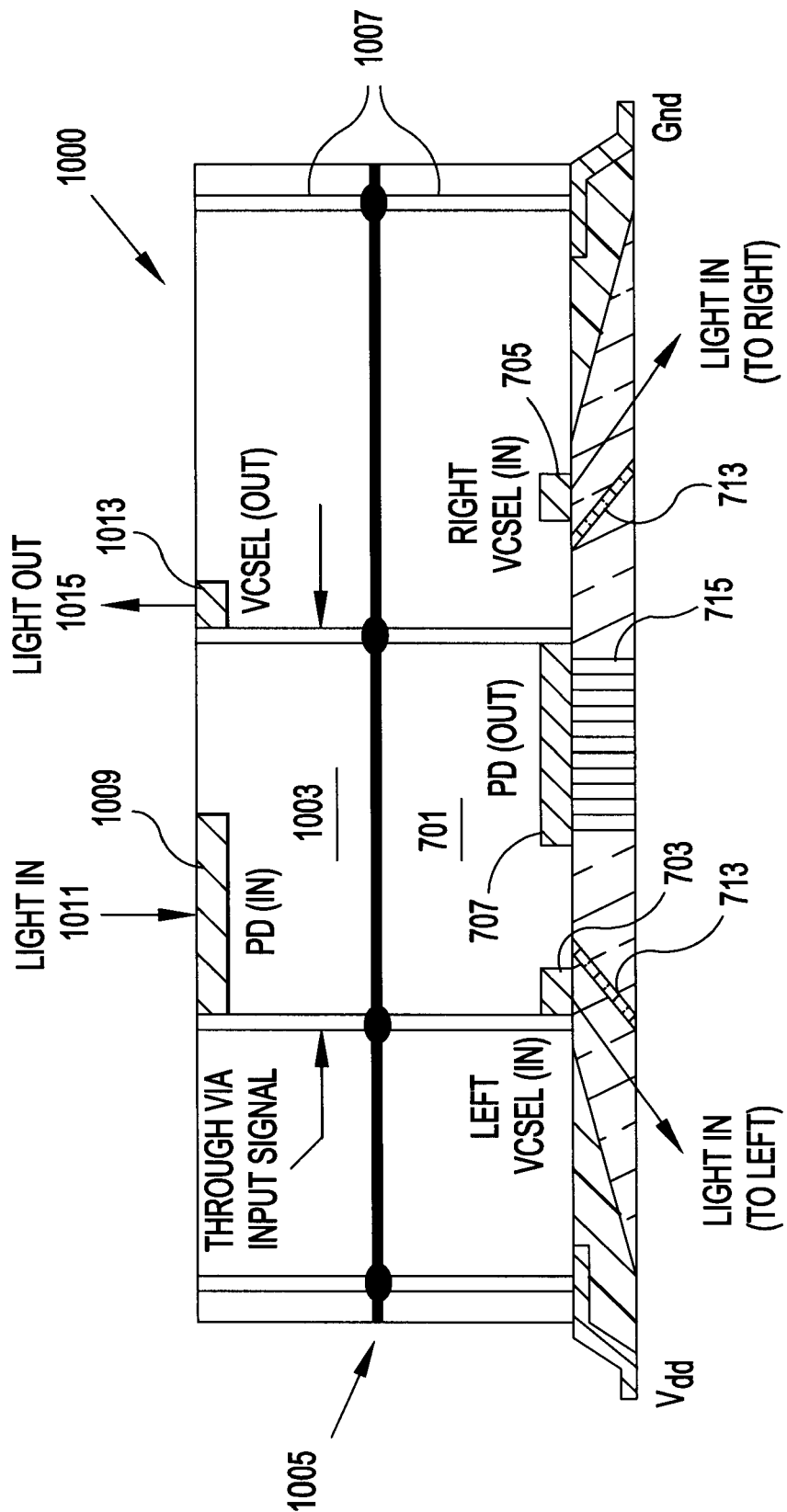
FIG. 10 shows an example of a structure 1000 for coupling an optical signals from external light source/sink to the on-backplane transceivers.

FIG. 10 shows an example of a structure 1000 for coupling an optical signals from external light source/sink to the on-backplane transceivers 701. In this example, a second chip 1003 is flip mounted back to back with on-backplane transceivers 701. The second chip 1003 also contains a laser 1013 and a photodiode 1009 and a solder interface 1005 connects it through vias 1007 to the first chip 701. Through vias 1007 provide power to the top chip 1003 and pass selected electrical signals between the two chips 701, 1003.

The photodetector 1009 on the top transceiver chip 1003 detects light 1011 from an external source, e.g., from a connected board or chip. The top photodetector 1009 converts the external light into an electrical signal and relays the electrical signal through the vias 1007 to drivers (not shown) for the lasers 703, 705 in the bottom chip 701. The lasers 703, 705 in the bottom chip 701 converts the electrical signal to an optical signal to recreate the optical signal, which is relayed to the backplane channel (not shown in this example) as previously described.

Signals in the opposite direction originate when the photodetector 707 on the bottom transceiver chip 701 detects/senses light in the backplane channel (not shown). The photodetector 707 converts the detected light into an electrical signal. The electrical signal passes back over through vias 1007, to a driver (not shown) for the laser 1013 in the top transceiver chip 1003. The laser 1013 in the top chip 1003 recreates the optical signal, and relaying the optical signal 1015 to an external sink, e.g., to a board.

Figure 11:
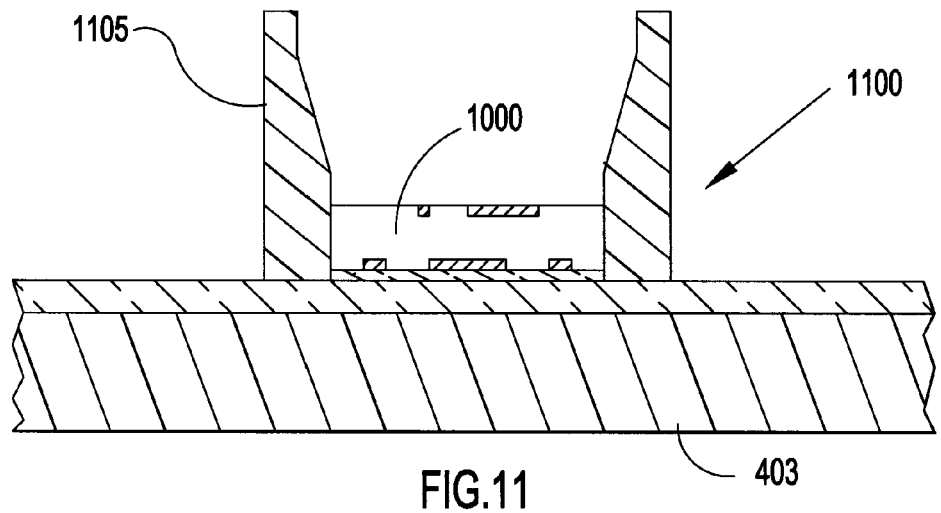
FIG. 11 shows an example backplane attachment structure.

FIG. 11 shows an example backplane attachment structure or backplane optical socket 1100. In this example, the dual-chip electro-optical transceiver 1000 is connected to a backplane 403 and "potted" into a flanged structure 1105 for easy attachment with an optical plug that is tolerant of fairly crude alignment.

Figure 12:
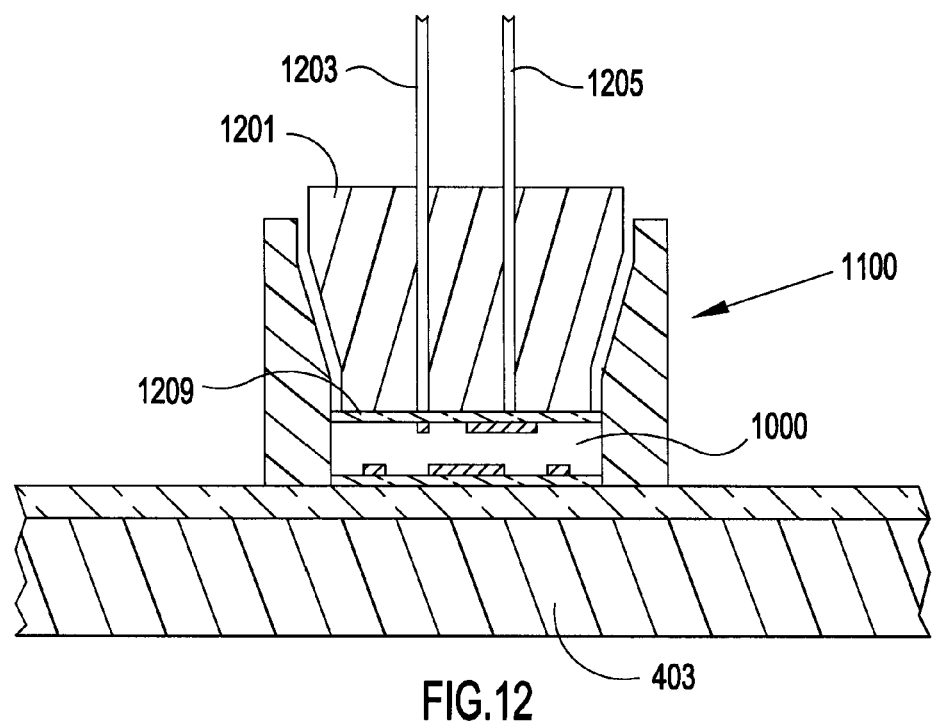
FIG. 12 shows a male optical plug 1201 inserted into the female flanged structure.

FIG. 12 shows a male optical plug 1201 inserted into the female flanged structure of the backplane optical socket 1100. The plug 1201 contains fibers 1203, 1205 carrying optical inputs 1203 and optical outputs 1205. The plug 1201 mechanically butts against the top chip 1003 of the dual-chip transceiver structure 1000. Optionally, this butted connection forms a raw optical interface 1209 that can be enhanced with optical gels. Thus, provided that the fiber loss is negligible, only the interface 1209 is lossy in the connection. It should be noted that the plug 1201 and associated cable 1203, 1205 can be plugged into a circuit board that is plugged into this same backplane 403 as further described hereinbelow or, the cable 1203, 1205 can run to another backplane (not shown) to extends the present invention to multiple frames, if losses permit.

Figure 13:
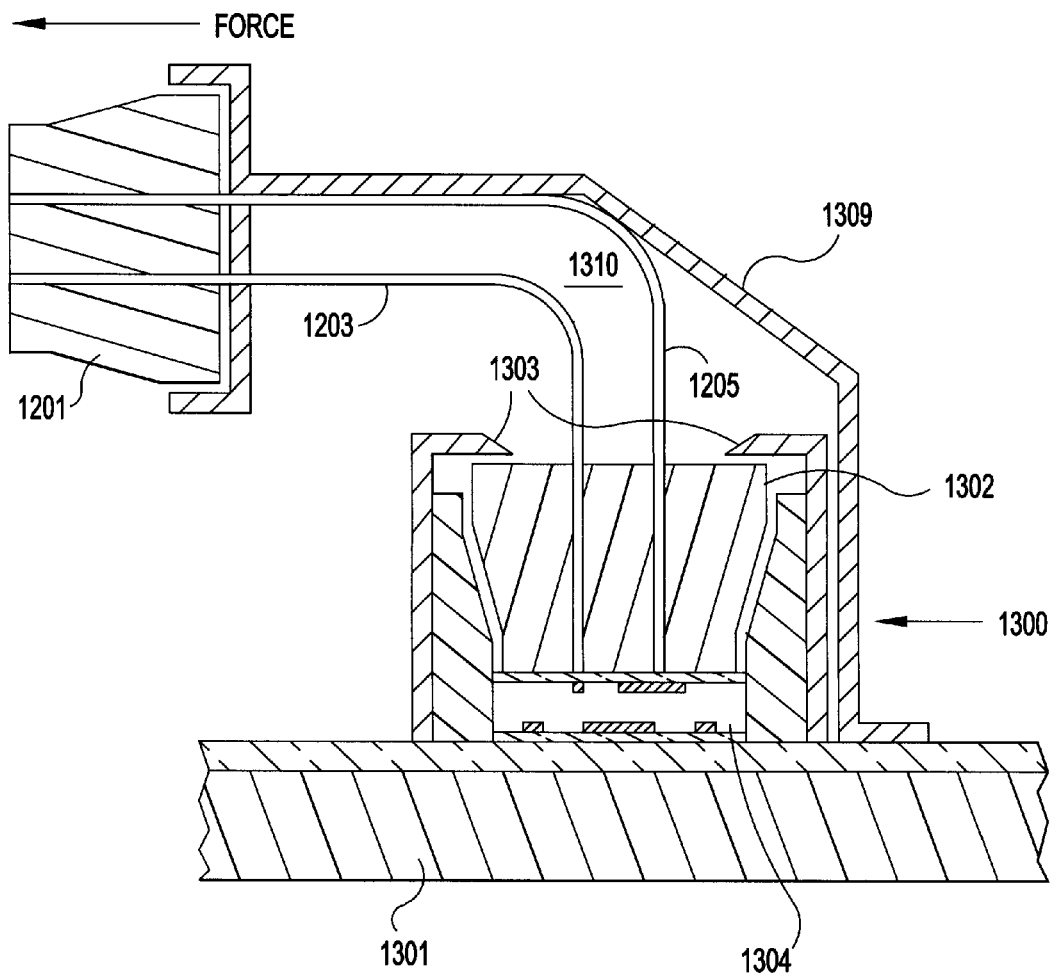
FIG. 13 shows an example of a board-to-backplane connector assembly according to a preferred embodiment of the present invention.

FIG. 13 shows an example of board-to-backplane connector assembly 1300 mounted on a preferred embodiment 401 according to the present invention. A board-backplane optical jumper 1310 includes a pair of plugs 1201 and 1302 attached to either end of optical cables 1203, 1205 and connects the preferred circuit board 401 to a backplane (not shown in this example). Spring clamps on board optical sockets 1303 hold the board plug 1302 in place to provide an optical connection to an onboard transceiver structure 1304 as described hereinbelow and, substantially similar to a transceiver, e.g., 1000 in FIG. 10. A spring 1309 attaches across the optical jumper 1310 to provide tension for adequate optical coupling and to maintain plug 1201 inserted into a backplane optical socket.

Figure 14:
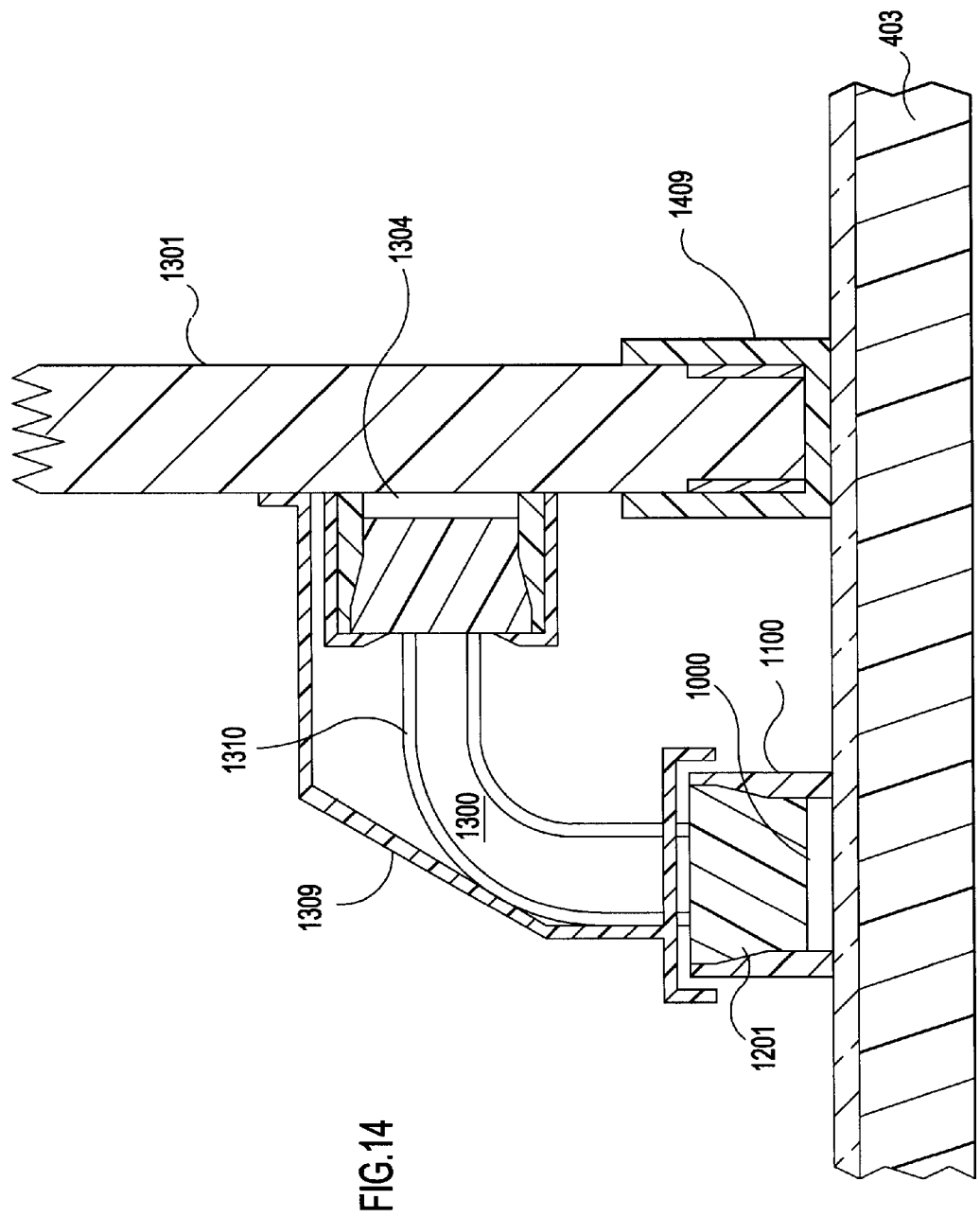
FIG. 14 shows an example of a preferred board attached to the backplane.

FIG. 14 shows an example of a preferred board 401 attached to the backplane 403. The board 401 is inserted on an edge into a typical electrical edge connector 1409 on the backplane 403. An optical jumper 1310 in a connector/cable assembly 1300, optically connects the board 401 to the backplane 403. The spring 1309 in the connector/cable assembly 1300 is mounted on the board 401 and forcibly holds the backplane plug 1201 in backplane optical socket 1100. Preferably, when the board 401 is inserted in the electrical edge connector 1409, each backplane plug 1201 automatically mates with an optical connector 1100 in the backplane optical socket 1100 making the optical connections. The optical signal repeats in both transceivers 1000, 1304 such that the total connection loss is due to the 2 raw interfaces at the plugs 1201, 1302. Since the plug-to-plug link budget can be ample (3-6 dB or even larger, if needed), the mechanical tolerances can be loose, and the cost of these plug and flange structures can be very low.

It should be noted that each connector/cable assembly 1300 can be used for a parallel bus interconnection. For example, with a linear array of lasers on 125 micron centers, a 1 inch wide plug having 2 rows of fibers could easily accommodate 80 signals in and 80 signals out. This can be used to implement an 8-byte bus with parity and control signals as discussed hereinbelow. Such a plug would have a form-factor and tolerance similar to a phone jack.

Figure 1:
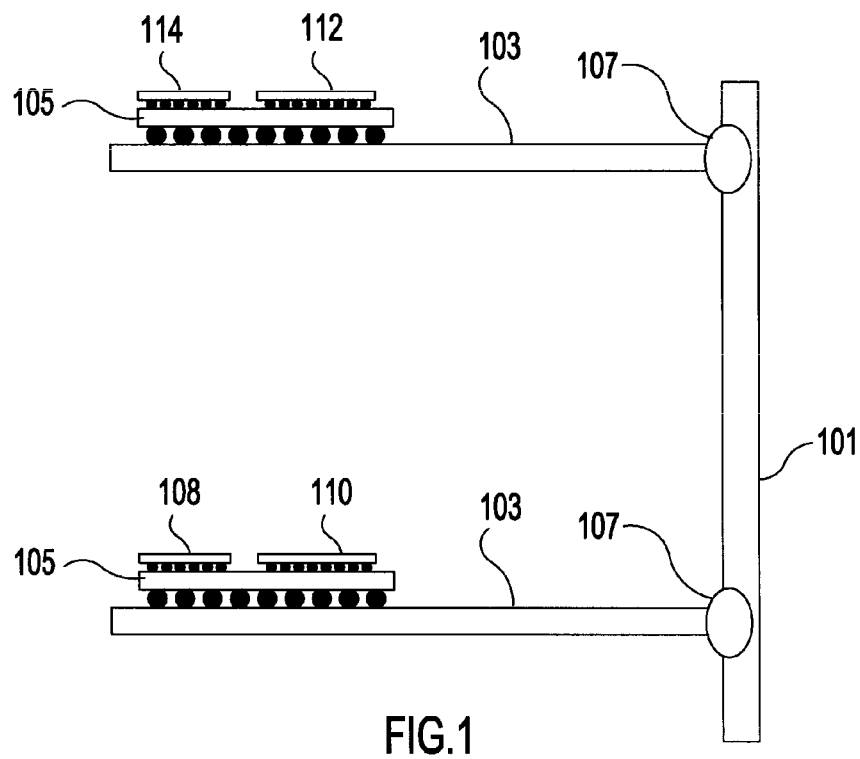
FIG. 1 shows an example of a state of the art electro-optical assembly with a passive backplane connecting two circuit boards each with mounted electro-optical components.
Figure 2A:
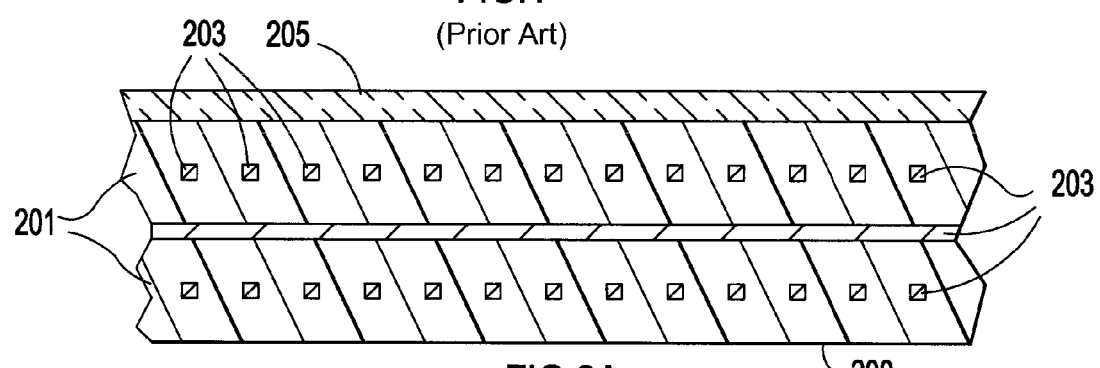
FIGS. 2A-B show an example of typical orthogonal cross sections of the general board structure 200 of either/both of the backplane and circuit boards.
Figure 2B:
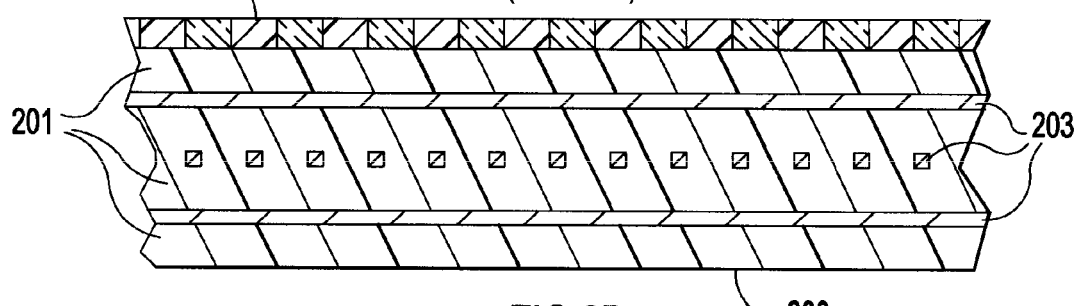
Figure 3:
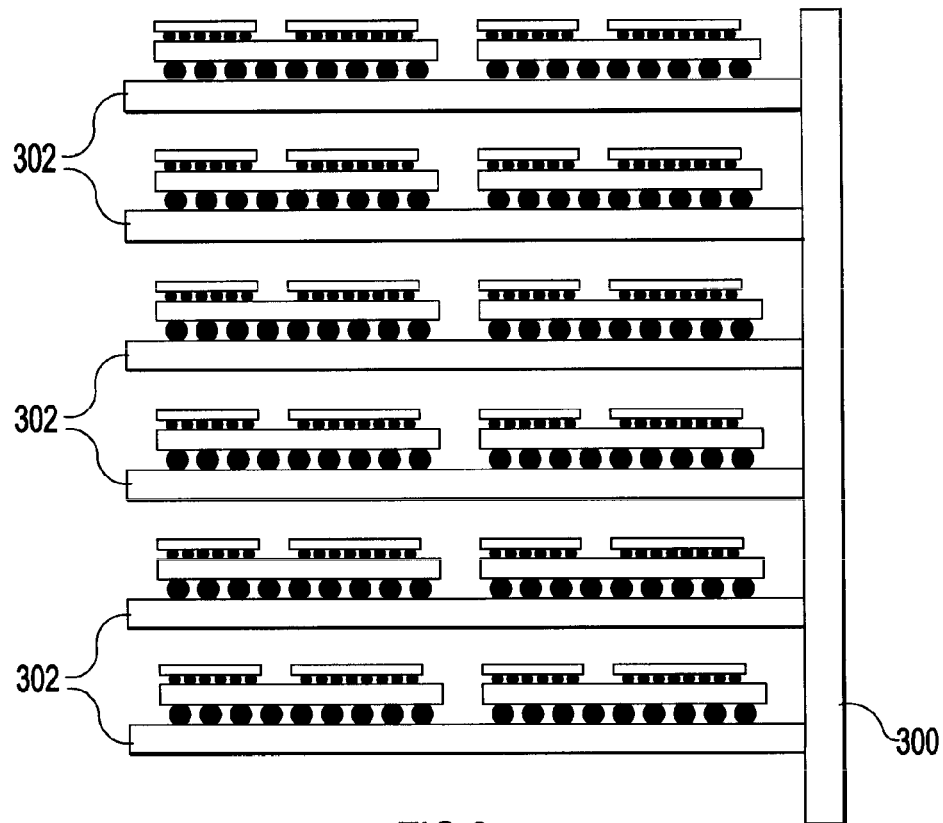
FIG. 3 shows an example of a multidrop backplane, e.g., in a large switch or a server backplane.
Figure 15:
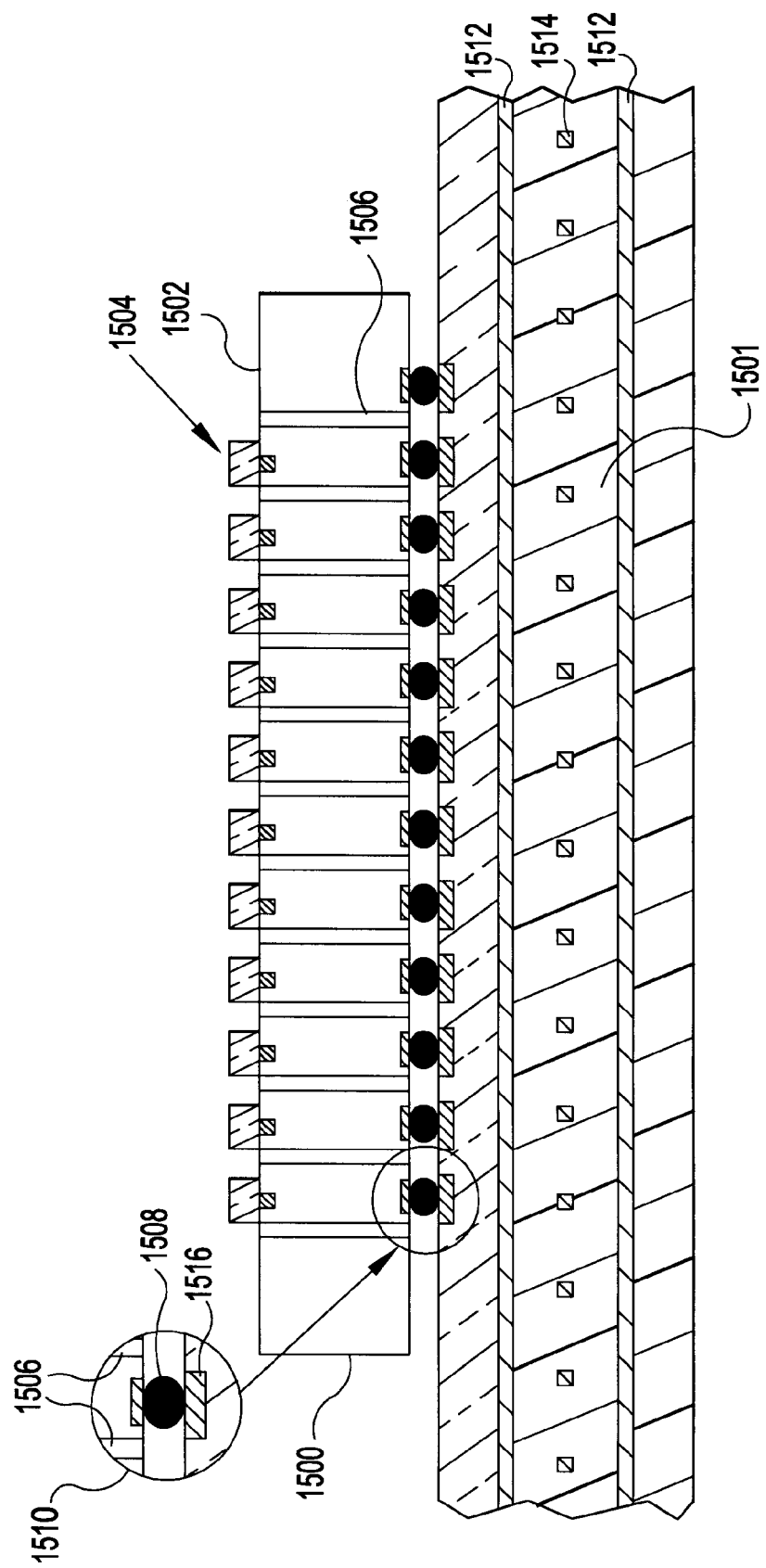
FIG. 15 shows an example of a multi-channel transceiver chip mounted on a preferred embodiment board.

FIG. 15 shows an example of a first preferred embodiment onboard multi-channel transceiver chip 1500 mounted on a board 1501 providing an optical interface to an optical connector at one end of an optical jumper, e.g., 1302 in FIG. 13. Thus, this onboard multi-channel transceiver chip 1500 provides an indirect optical connection to the board 1501 for an optical jumper. Optical signals from an optical jumper at the top surface 1502 of the multi-channel transceiver chip 1500 are provided to optical transceivers 1504 which convert the optical signals to electrical signals. The electrical signals pass on vias 1506 through the multi-channel transceiver chip 1500 to a suitable I/O chip attach, e.g., solder balls 1508, shown in further detail in inset 1510. The preferred board 1501 includes wiring and power layers 1512, 1514 oriented perpendicularly to each other, analogous to backplane wiring described in FIGS. 2A-B. Metal pads 1516 in a chip attach location on the board 401 are connected (not shown) to appropriate wiring and power layers 1512, 1514. The preferred board 401 is substantially similar in construction to the backplane.

It should be noted that the onboard multi-channel transceiver chip 1500 of this example is shown mounted on a printed circuit board 1501 that may not have onboard optics and is used as an optical connection to the board. In particular, the onboard multi-channel transceiver chip 1500 can attach such a board to an optical backplane 400, especially where it is desirable to provide optical signals directly to the board instead of through an edge connector, e.g., 1409 in FIG. 14. It should be noted that if there is no onboard optical interconnection, the multi-channel transceiver chip 1500 may be mounted on the backplane and, the electrical signals provided through an edge connector to the board. It should also be noted that an optical jumper connection to an optical backplane is described for example only. Any suitable optical connection may be used to connect any suitable optical source/sink, e.g., to another frame or backplane.

Figure 16:
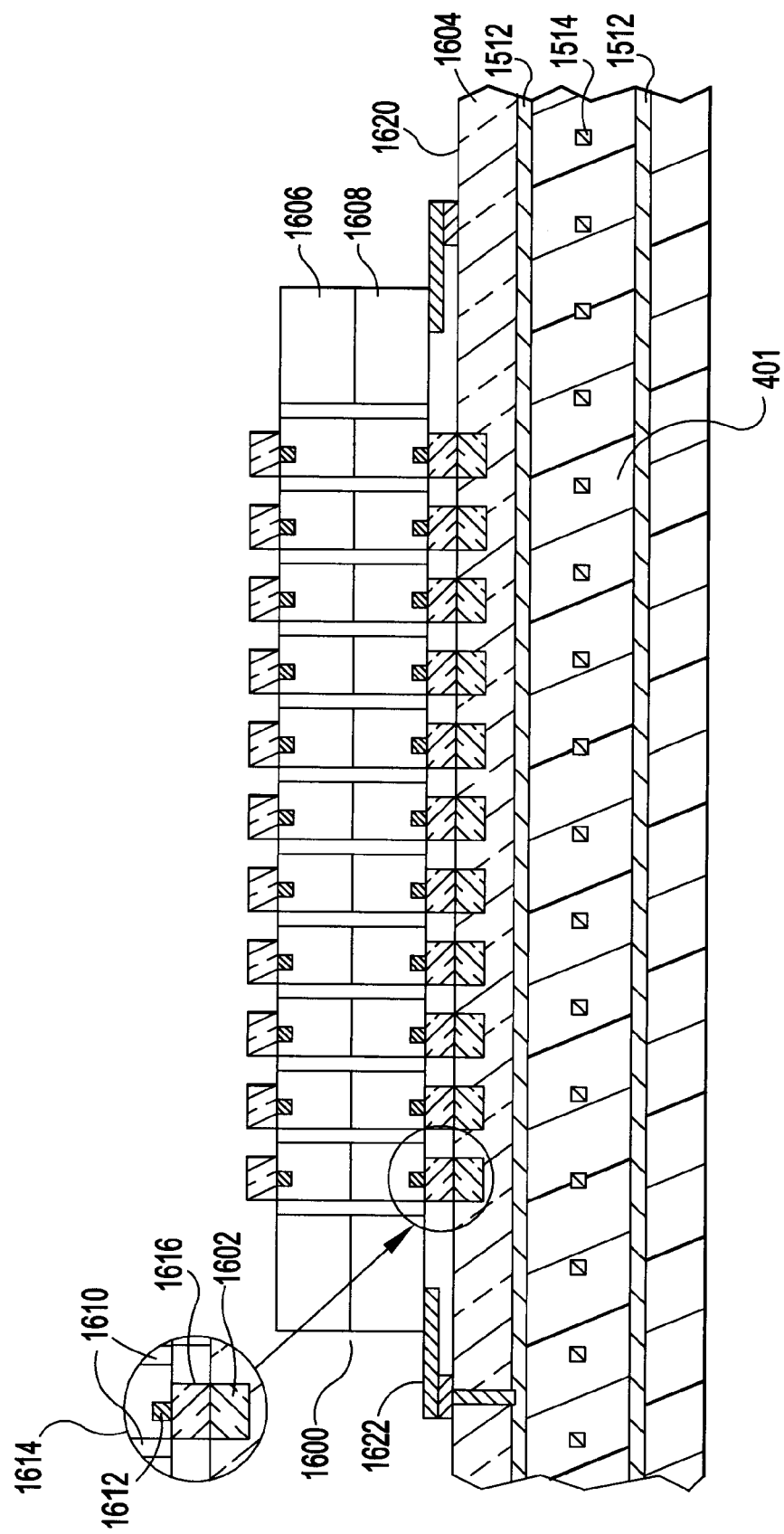
FIG. 16 shows an example of a second multi-channel transceiver assembly mounted on a preferred embodiment board.

FIG. 16 shows an example of a second preferred embodiment onboard multi-channel transceiver assembly 1600 mounted on a preferred embodiment board 401. In this embodiment, the multi-channel transceiver assembly 1600 is optically coupled to board optical channels 1602 in the surface 1604 of the preferred embodiment board 401. Thus, this onboard multi-channel transceiver chip 1600 has a direct optical connection to the board 401. The multi-channel transceiver assembly 1600 is substantially a parallel multi-signal version of the single back to back chip assembly of chips 701, 1003 of FIG. 10. Optical signals are received by the top transceiver chip 1606 and relayed as electrical signals to the lower chip 1608 over through vias 1610. Optical transceivers 1612 on the lower chip 1608, shown in detail in inset 1614, convert the optical signals from through vias 1610 back to optical signals which are passed through on-chip optical coupling 1616 to respective optical channels 1602. Similarly, optical signals from the board follow a reverse path and are optically transmitted out the top transceiver chip 1606 into a cable (not shown). Power and ground contacts 1620, 1622 may be provided outboard of lower chip 1608 to board 401.

Figure 17:
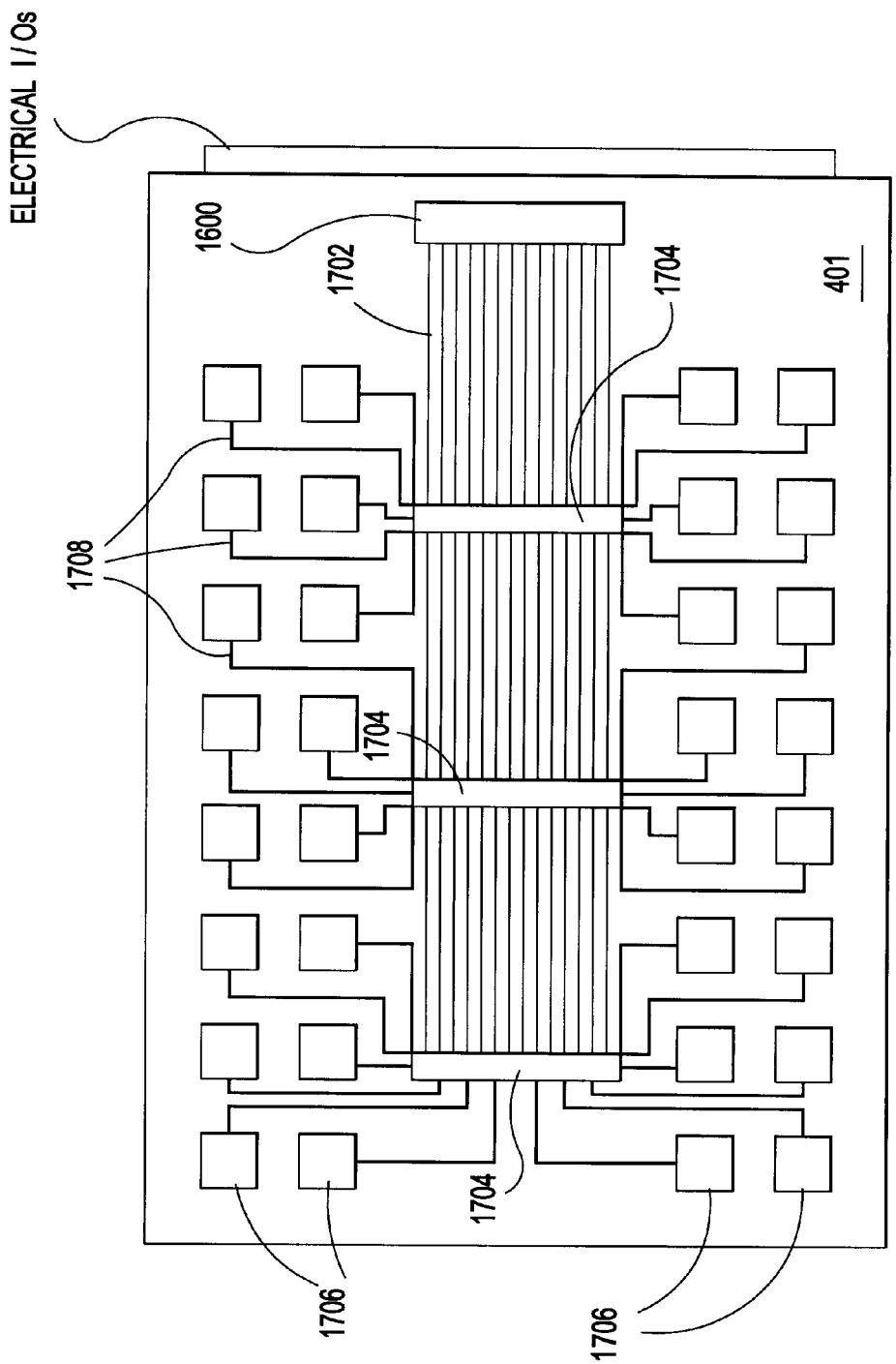
FIG. 17 shows an example of a preferred embodiment board or circuit card with representative simple optical wiring.

FIG. 17 shows an example of a preferred embodiment board 401 or circuit card with representative simple optical wiring 1702. In this example, the board 401 includes a single layer of straight optical wires or channels 1700. Optical board I/Os enter and leave the board 401 at an off-board transceiver assembly 1600. In this embodiment, the transceiver assembly 1600 optically communicates with a number of onboard transceivers 1704 over the optical wiring channels 1700. Further, off-board transceiver assembly 1600 is an optical to optical interface, while onboard transceivers 1704 are each optical to electrical interfaces. So, in this example, the off-board transceiver assembly 1600 only connects an external entity, e.g., the backplane, to the onboard transceivers 1704 and is isolated from other chips 1706 on the board 401. The onboard transceivers 1704 are optically connected to each other and to the off-board transceiver and are electrically connected to other chips 1706 on the board 401.

In this example, electrical wiring (not shown) for logic and memory in chips 1706 may be contained within localized board areas, with chips 1706 within a particular area interconnected with short electrical wires (not shown). For longer paths between areas (e.g., paths that must traverse a major portion of the board), the logic or memory chips 1706 communicate through one of the onboard transceiver chips 1704. Thus, electrical paths between chips 1706 is contained to a localized area or a short electrical connection 1708 to an onboard transceiver chip 1704. So a signal from a chip on one end of the board 401 to the other, passes electrically to an onboard transceiver 1704, optically between onboard transceivers 1704 and, passes electrically from the onboard transceiver 1704 to the receiving chip. Thus, the path includes only a short electrical connection between the onboard transceivers 1704 and the origination/destination logic or memory chips 1706. Advantageously, this embodiment provides a very simple optical infrastructure (e.g., a single straight layer of channels) and, the logic and memory chips 1706 may be state of the art CMOS chips with only electrical I/Os. Only the transceiver chips have optical components. Further, special chip packaging is not required for the preferred board of this example.

Figure 18A:
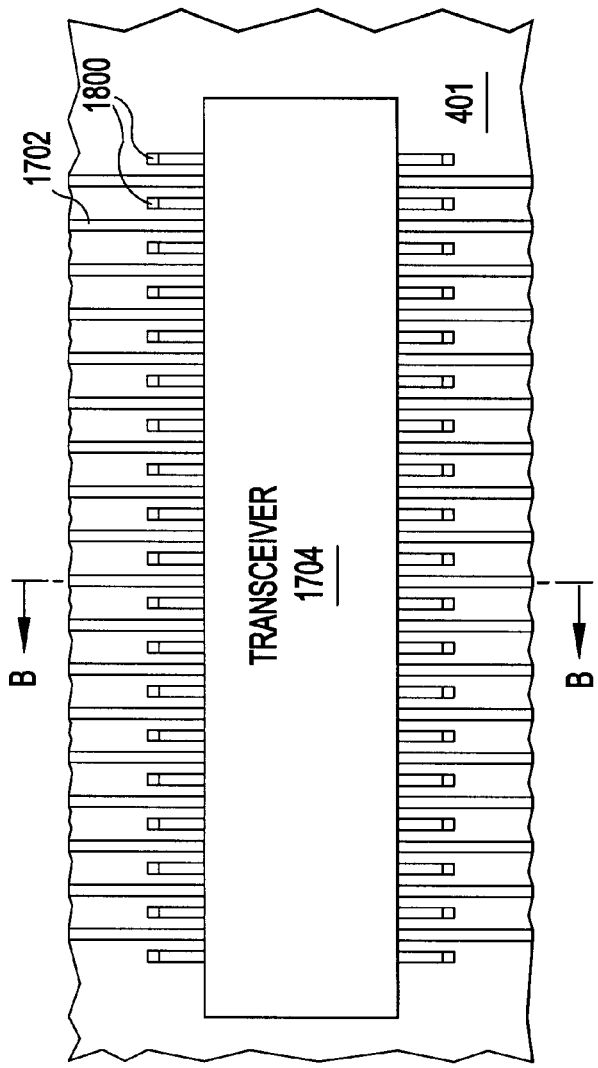
FIGS. 18A-B show a top view and a cross-sectional view of an example of a mounted preferred embodiment onboard transceiver chip.
Figure 18B:
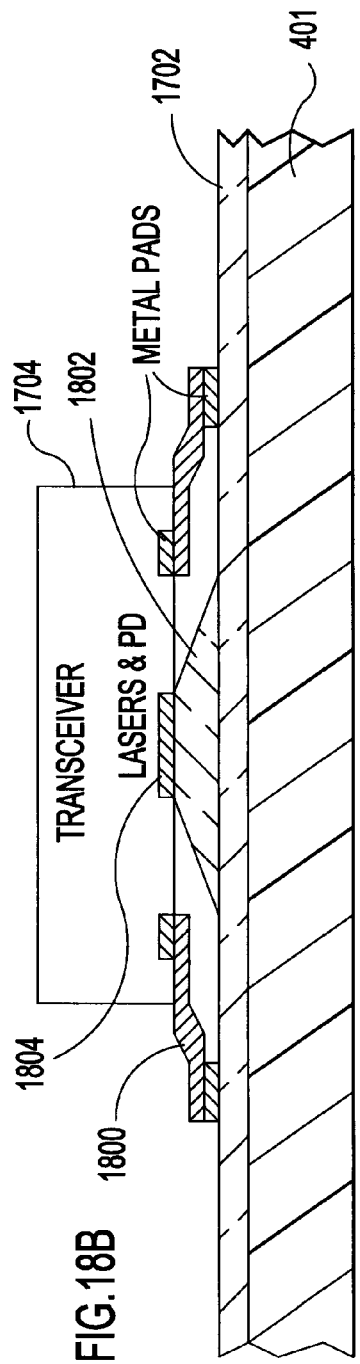

FIGS. 18A-B show a top view and a cross-sectional view through B-B of an example of a preferred embodiment onboard transceiver chip 1704 mounted on a preferred embodiment board 401. The parallel optical channels 1702 pass beneath the chip 1704 and electrical (e.g., solder) connections 1800 are interdigitated with respect to the optical channels 1702. Optical signals between the transceiver chip 1704 and the optical channels 1702 pass through an optical interface 1802 located between the optical channels 1702 and respective chip elements 1804 (i.e., lasers and photodiodes). The electrical connections 1800 may be wire bonds, soldered pads or solder balls or any other suitable board to chip direct attach technology. It should be noted that soldering mechanically aligns the chip 1704 with respect to the optical channels 1702.

Figure 19:
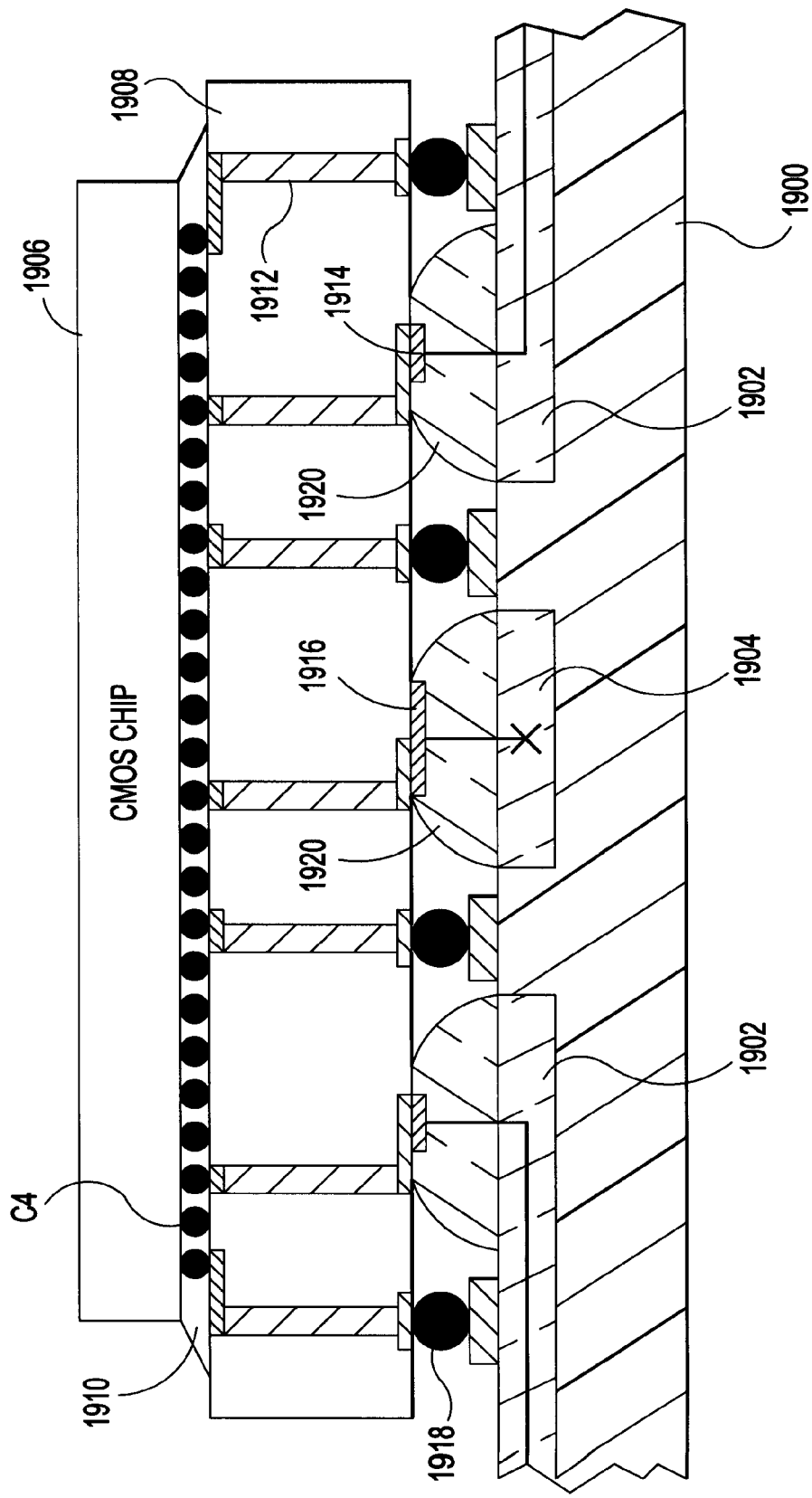
FIG. 19 shows a preferred embodiment wherein optical wave guides are aligned in different directions (e.g., perpendicular to each other) within the board.

FIG. 19 shows a preferred embodiment assembly for high performance optical interconnection of state of the art chips to the board 1900 and wherein optical wave guides 1902, 1904 are aligned in different directions (e.g., perpendicular to each other) within the board 1900. In this embodiment one or more chips 1906, such as a state of the art CMOS processor or CMOS memory is mounted on an active optical interposer 1908. The chip(s) 1906 are attached to the optical interposer 1908 with a typical chip attach technology, e.g., controlled collapsible chip connect (C4). A chip underfill 1910, e.g., epoxy, strengthens the attachment. Metal vias 1912 through the optical interposer 1908 pass electrical signals from the chip(s) to the board 1900 and to the active interposer elements (lasers 1914 and photodiodes 1916). Electrical signals and power and ground are passed to the optical interposer 1908 at mounting pads 1918. The optical interposer 1908 is attached at the mounting pads 1918 using a suitable attach technology such a ball grid array (BGA) attach. Light guide structures 1920 between the optical interposer 1908 and the board 1900 optically couple the active interposer elements to optical wave guides 1902, 1904. Since underfill is not required beneath the optical interposer 1908, the secondary solder process attaching the optical interposer 1908 to the board 1900 can be at relatively low temperature. Preferably, the light guide structure is of a flexible optical transmissive material, e.g., a transparent gum, rubber, plastic or glass or, are a compliant (semi fluid) forming beads as shown in FIG. 19. Optionally, however, light guide structures 1920 may be prefabricated solid structures, e.g., glass beads that are halved and glued to the board 1900. This embodiment has particular application to high performance systems, e.g., wherein state of the art memory chips are closely coupled to microprocessors with multi-GHz operating clocks to maximize system performance.

Figure 20:
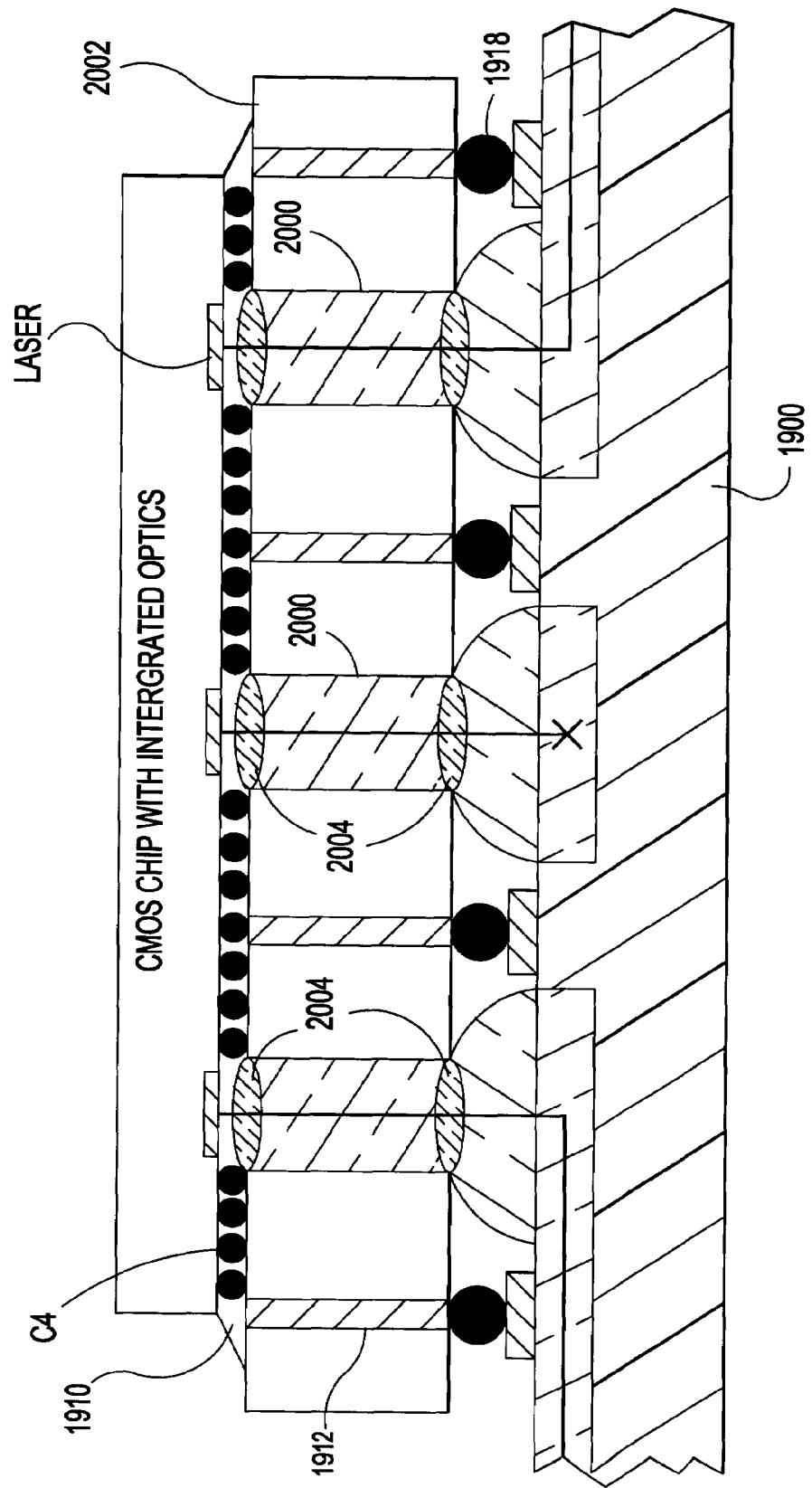
FIG. 20 shows a variation on the embodiment of FIG. 19 for chips (processors, logic or memory) with integrated active optical elements.

FIG. 20 shows a variation on the embodiment of FIG. 19 for chips (processors, logic or memory) with integrated active optical elements. An example of active optical elements integratable on state of the art CMOS is provided in allowed U.S. patent application Ser. No. 10/305,516 entitled "HIGH SPEED DATA CHANNEL INCLUDING A CMOS VCSEL DRIVER AND A HIGH PERFORMANCE PHOTODETECTOR AND CMOS PHOTORECEIVER" to Boszo et al., filed coincidentally herewith, assigned to the assignee of the present invention, and incorporated herein by reference. In this embodiment, optical vias 2000 are drilled (or etched) through the optical interposer 2002 and filled with a matched-index material (e.g., glass). The optical interposer 2002 may be completely passive. Preferably, for better optical performance, the via ends are shaped into lenses 2004 using any of several known methods. In this embodiment, the underfill epoxy 1910 is optional and, if used, must also be a good optical match. Furthermore, chips with active optical may be mounted directly on the board 1900 using well known direct chip attach technologies in combination with the above described optical transceiver mounting techniques.

Figure 21:
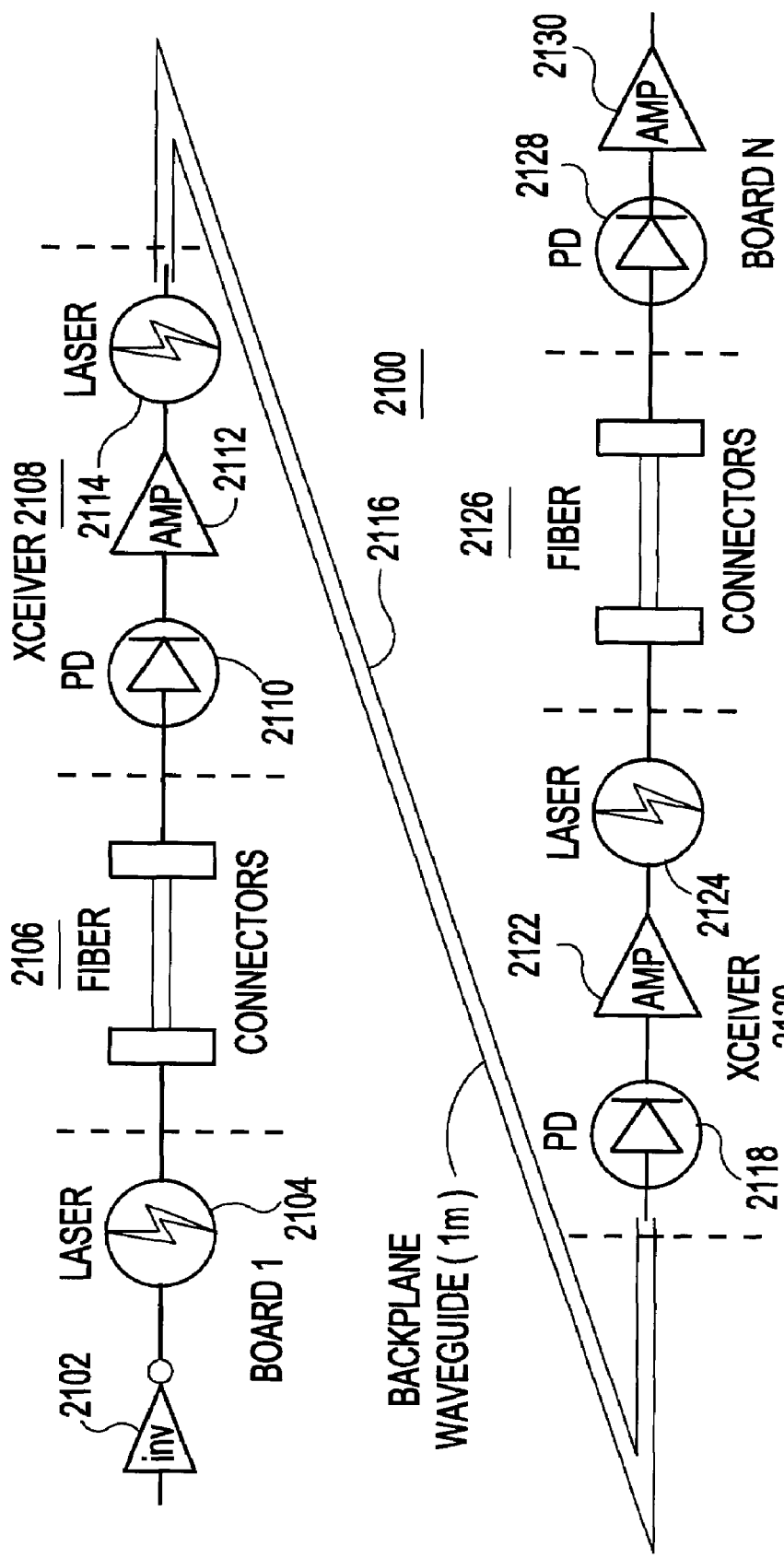
FIG. 21 shows a schematic representative of a worst case system path.

FIG. 21 shows a schematic representative of a worst case system path 2100, e.g., for the backplane assembly 400 of FIG. 4 with boards 401 such as the example in FIG. 17 mounted thereon. An electrical signal originating in inverter 2102 is converted to light in a first laser 2104 in an off-board transceiver assembly on a first Board, e.g., Board 1 in FIG. 5. The light passes through an optical jumper 2106 to a backplane transceiver 2108, e.g., chip 1003 in FIG. 10. A photodetector 2110 converts the optical energy to electrical, which is amplified by amplifier 2112. The output of amplifier 2112 is converted back to light in laser diode 2114. The laser diode 2114 drives an optical channel 2116 in a backplane, e.g., 401 described hereinabove, which in this example is 1 meter long. A photodetector 2118 in another transceiver 2120 at the other end of the optical channel 2116 converts the optical energy from the backplane optical channel 2116 to electrical energy that is amplified by amplifier 2122. The output of amplifier 2122 is converted back to light in laser diode 2124. The laser diode 2124 drives another optical jumper 2126 connected to an off-board transceiver assembly on a receiving board (e.g., Board N in FIG. 5) at the other end of the backplane optical channel 2116. A photodetector 2128 in the receiving board off-board transceiver assembly converts received optical energy to electrical, provided sufficient optical energy arrives. The electrical energy from photodetector 2128 is amplified by amplifier 2130 and distributed by the off-board transceiver assembly to onboard transceivers.

Thus, in this example there are 6 signal conversions and 1 meter of transit. Each of the conversions takes on the order of 10 picoseconds and the transit time is roughly 5 nanoseconds. Thus, the end-to-end latency is dominated by transit time and roughly 5 nanoseconds. Channel frequency is limited by the response of the slowest amplifier in the path and/or, for a parallel bus, the skew between signals.

So for an 8-byte bus example provided hereinabove, the transceivers for all bits of the 8 byte quanta reside on the same chip minimizing response variation and skew. Further, for a parallel bus application, the signals should be sent source-synchronously, i.e., with an accompanying clock signal as one of the spare bus signals. Furthermore, because the electro-optical devices and amplifiers response is in the 10s of picoseconds, this arrangement can readily accommodate signals of several Ghz (perhaps 10 Ghz) without resorting to exotic signaling techniques. Also, at these operating speeds, channel latency will be several cycles because latency is dominated by transit time, 5 nanoseconds in this example.

Latency that is several cycles long poses a challenging arbitration problem for a shared bus implementation. Specifically, between two boards on the backplane, the signal latency is primarily determined by the physical distance on the backplane between the two boards. As can be seen from the above examples, this distance range from a inches for adjacent boards (hence a cycle or two) to as much as a meter (10s of cycles). Therefore, when the boards in the shared bus system all vie for the bus, the requesting signals arrive at different times at the bus arbitrator (the board selected for making all arbitration decisions), i.e., depending on where each of the requesting boards reside no the backplane. Further, different boards may see the order of arrivals differently. Since each of the boards most likely will not see the requests in the same consistent order, arbitration protocol is required to guarantee that the arbitration logic makes consistent bus grant decisions.

For example, N backplane physical channels of the control channels are allocated for a "bus request" signal for each board. Each "bus request" signal is an assert only signal, i.e., it is asserted (e.g., carrying optical energy) only when a board is requesting the bus. Further, it remains asserted until bus control is granted to the requesting board. Typically, the arbitrator or arbitration master board (e.g., the physically center most board on the backplane) grants board requests consistent with the observed order of receiving requests. Each board (other than the arbitrator) is assigned an identification or bus grant ID. The arbitrator grants bus control by selecting the bus grant ID for one of the boards, e.g., by providing the ID on a $\log_2(N)+1$ bus grant channel dedicated to bus grant signaling, e.g., by optically signaling the grant ID in hexadecimal. Likewise, the arbitrator synchronizes arriving bus grant IDs on the 80-pin bus with a source-synchronous clock that arrives at the boards with the bus grant IDs.

Advantageously, the present invention addresses all of the problems found in state of the art systems. In particular, the present invention is directed toward a large switch or server environment in which there are multiple boards connected to a backplane. The present invention allows for a wide range of wave guide materials (i.e., is tolerant of channel loss) and does not require precise mechanical alignment (i.e., is tolerant of large coupling losses in the board-to-backplane connectors). The present invention allows multidropping signals transmitted from one board, so that multiple boards can receive the signal and at a wide range of system scaling (i.e., a few boards to many boards) based on a single physical infrastructure (backplane).

Having thus described preferred embodiments of the present invention, various modifications and changes will occur to a person skilled in the art without departing from the spirit and scope of the invention. It is intended that all such variations and modifications fall within the scope of the appended claims. Examples and drawings are, accordingly, to be regarded as illustrative rather than restrictive.

We claim:
1. An optically connectable circuit board comprising:
a printed circuit card with a plurality of component attach locations and a plurality of optical channels, at least one surface including ones of said plurality of optical channels;
a plurality of electronic components mounted in said component attach locations;
at least two electronic components of said plurality of electronic components including a plurality of optical transceivers, a first electronic component of said at least two electronic components being an optical connection to said printed circuit card; and
a second electronic component of said at least two electronic component comprises:
an optical interposer including at least one chip attach location on a first surface and attached to one said component attach location, at least one integrated circuit chip mounted on said chip attach location, and
optical transceivers electrically connected to said integrated circuit chip and optically connected to corresponding said optical channels;
wherein said optical transceivers optically connect said second electronic component with said plurality of optical transceivers included with said first electronic component through said plurality of optical channels; and
wherein one or more of said plurality of component attach locations are on said at least one surface.

2. The optically connectable circuit board as in claim 1, wherein said plurality of optical channels are in layers in said printed circuit card oriented in at least two directions.

3. The optically connectable circuit board as in claim 2, wherein said at least one integrated chip is indirectly connected to said printed circuit board through said optical interposer.

4. The optically connectable circuit board as in claim 2, wherein said integrated circuit chip is directly connected optically to said printed circuit card, said optical transceivers are on said integrated circuit chip, said optical interposer further including a plurality of optical vias located such that when said integrated circuit chip is mounted in said chip attach location, each of said optical transceivers is optically connected to a corresponding one of said optical vias.

5. The optically connectable circuit board as in claim 3, wherein said optical interposer is an active interposer directly connected optically to said printed circuit card, said optical transceivers being on a second surface of said active interposer, said second surface opposite said first surface.

6. The optically connectable circuit board as in claim 5, wherein each end of said optical vias is lens shaped.

* * * * *